US010892675B2

(12) United States Patent
Lee et al.

(10) Patent No.: US 10,892,675 B2
(45) Date of Patent: Jan. 12, 2021

(54) VOLTAGE CONVERTING CIRCUIT AND CONTROL CIRCUIT THEREOF

(71) Applicant: Excelliance MOS Corporation, Hsinchu County (TW)

(72) Inventors: Ching-Tsan Lee, Hsinchu County (TW); Pei-Ting Yang, Hsinchu County (TW); Ming-Hung Chien, Hsinchu County (TW)

(73) Assignee: Excelliance MOS Corporation, Hsinchu County (TW)

(*) Notice: Subject to any disclaimer, the term of this patent is extended or adjusted under 35 U.S.C. 154(b) by 295 days.

(21) Appl. No.: 16/104,957

(22) Filed: Aug. 20, 2018

(65) Prior Publication Data
US 2019/0372452 A1 Dec. 5, 2019

(30) Foreign Application Priority Data
Jun. 1, 2018 (TW) .............................. 107118986 A

(51) Int. Cl.
*G05F 1/569* (2006.01)
*H02M 1/08* (2006.01)
*H02H 3/00* (2006.01)
*H03K 17/081* (2006.01)
(Continued)

(52) U.S. Cl.
CPC .............. *H02M 1/08* (2013.01); *G05F 1/569* (2013.01); *H02H 3/003* (2013.01); *H02H 3/18* (2013.01); *H03K 17/0412* (2013.01); *H03K 17/08104* (2013.01)

(58) Field of Classification Search
CPC .. H02H 3/18; H02H 3/003; H03K 2217/0081; H03K 17/0412; H03K 2217/0054; G05F 1/569; H02M 1/08
See application file for complete search history.

(56) References Cited

U.S. PATENT DOCUMENTS

| 7,362,163 | B1* | 4/2008 | Raghavan | H02M 3/07 327/535 |
| 9,964,975 | B1* | 5/2018 | Zanetta | G11C 5/145 |
| 10,504,562 | B2* | 12/2019 | Rowley | G06F 1/3275 |

(Continued)

FOREIGN PATENT DOCUMENTS

| CN | 102386753 | 3/2012 |
| TW | I430531 | 3/2014 |
| TW | I605567 | 11/2017 |

*Primary Examiner* — Harry R Behm
(74) *Attorney, Agent, or Firm* — JCIPRNET

(57) ABSTRACT

A voltage converting circuit and a control circuit thereof are provided. The control circuit includes a comparator, a clock generator, and a boost circuit. The comparator compares an input voltage with an output voltage to generate a comparison signal. The clock generator generates a clock signal according to the comparison signal to enable the clock signal to have a first frequency in a first time interval and to have a second frequency in a second time interval. The first frequency is higher than the second frequency. The first time interval occurs before the second time interval. The boost circuit receives the clock signal, pulls up a control signal of a driving switch in the first time interval according to a first driving capability, and generates the control signal in the second time interval according to a second driving capability. The first driving capability is greater than the second driving capability.

7 Claims, 5 Drawing Sheets

(51) Int. Cl.
*H02H 3/18* (2006.01)
*H03K 17/0412* (2006.01)

(56) References Cited

U.S. PATENT DOCUMENTS

| | | | |
|---|---|---|---|
| 2004/0239403 A1* | 12/2004 | Farley | H03K 17/0822 |
| | | | 327/437 |
| 2014/0049303 A1* | 2/2014 | Chen | H03L 7/089 |
| | | | 327/157 |
| 2016/0156343 A1 | 6/2016 | Chen | |
| 2016/0181913 A1* | 6/2016 | Feng | H02M 3/07 |
| | | | 327/536 |
| 2017/0012617 A1* | 1/2017 | Moctezuma | H02H 3/087 |
| 2017/0317583 A1* | 11/2017 | Forghani-Zadeh | |
| | | | H03K 17/04206 |
| 2019/0214973 A1* | 7/2019 | Choi | H02M 3/26 |

\* cited by examiner

VOLTAGE CONVERTING CIRCUIT AND CONTROL CIRCUIT THEREOF

CROSS-REFERENCE TO RELATED APPLICATION

This application claims the priority benefits of Taiwan application serial no. 107118986, filed on Jun. 1, 2018. The entirety of the above-mentioned patent application is hereby incorporated by reference herein and made a part of this specification.

BACKGROUND

Field of the Invention

The invention relates to a voltage converting circuit and a control circuit thereof. More particularly, the invention relates to a voltage converting circuit capable of quickly activating a driving switch and a control circuit thereof.

Description of Related Art

In the conventional technical field, a power supply circuit is disposed with a driving switch for supplying an output voltage by turning on the driving switch. Generally, in a condition that the driving switch is provided with an input voltage, and when a scenario that the output voltage is transiently greater than the input voltage (i.e., a reverse voltage state) occurs, a conventional power supply circuit usually pulls down a voltage level of a control terminal of the driving switch to a ground voltage level via a reverse voltage protection circuit, thereby turning off the driving switch.

However, when the reverse voltage state of the driving switch is relieved, the voltage level of the control terminal of the driving switch has to be boosted from the ground voltage level to a turn-on voltage level to re-activate the driving switch, and if a speed of boosting the voltage level of the control terminal is too slow, it takes more time to re-activate the driving switch, which causes affection to work efficiency of the power supply circuit.

SUMMARY

The invention provides a voltage converting circuit and a control circuit thereof capable of quickly re-activating a driving switch when a reverse voltage protection mechanism is relieved.

According to an embodiment of the invention, a control circuit for controlling a driving switch is provided. Two terminals of the driving switch respectively receive an input voltage and an output voltage. The control circuit includes a comparator, a clock generator, and a boost circuit. The comparator receives the input voltage and the output voltage and compares a voltage level of the input voltage with a voltage level of the output voltage to generate a comparison signal. The clock generator is coupled to the comparator. The clock generator receives the comparison signal and generates a clock signal according to the comparison signal. The clock generator enables the clock signal to have a first frequency in a first time interval and to have a second frequency in a second time interval, wherein the first frequency is higher than the second frequency, and the first time interval occurs before the second time interval. The boost circuit is coupled to the clock generator and a control terminal of the driving switch. The boost circuit receives the clock signal. The boost circuit pulls up a voltage level of the control signal of the driving switch according to a first driving capability in the first time interval and generates the control signal according to a second driving capability in the second time interval, wherein the first driving capability is greater than the second driving capability.

In an embodiment of the invention, the clock generator includes a mode signal generator and an oscillator. The mode signal generator is coupled to the comparator. The mode signal generator receives the comparison signal and performs a timing operation according to the comparison signal, so as to generate a mode signal. The oscillator is coupled to the mode signal generator. The oscillator receives the mode signal and adjusts a frequency of the clock signal according to the mode signal.

In an embodiment of the invention, the mode signal generator includes a timer and a logic operator. The timer performs the timing operation based on the comparison signal to generate a timing result. The logic operator is coupled to the timer and executes a logic operation according to the comparison signal and the timing result to generate the mode signal.

In an embodiment of the invention, the clock generator includes a bias voltage generator and a voltage control oscillator. The bias voltage generator is coupled to the comparator. The bias voltage generator receives the comparison signal and generates a bias voltage according to the comparison signal. The voltage control oscillator is coupled to the bias voltage generator. The voltage control oscillator receives the bias voltage to generate a clock signal and determines a frequency of the clock signal according to the bias voltage.

According to an embodiment of the invention, a voltage converting circuit is provided. The voltage converting circuit includes a driving switch and the control circuit described above.

In an embodiment of the invention, the voltage converting circuit further includes a reverse voltage protection circuit. The reverse voltage protection circuit is coupled to the control terminal of the driving switch. When a reverse voltage state occurs, the reverse voltage protection circuit provides a reverse control signal to the control terminal of the driving switch to drive the driving switch to be turned off.

To sum up, in the embodiments of the invention, the control circuit of the voltage converting circuit is disposed with the boost circuit. The boost circuit can receive the clock signal at different frequencies respectively in the first time interval and the second time interval, so as to pull up the control signal of the driving switch according to the first driving capability in the first time interval and to generate the control signal of the driving switch according to the second driving capability in the second time interval, wherein the first driving capability is greater than the second driving capability. In this way, when a reverse voltage protection mechanism of the voltage converting circuit is relieved, the control circuit can quickly activate the driving switch via the boost circuit, so as to allow the driving switch to quickly enter a normal operation state.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
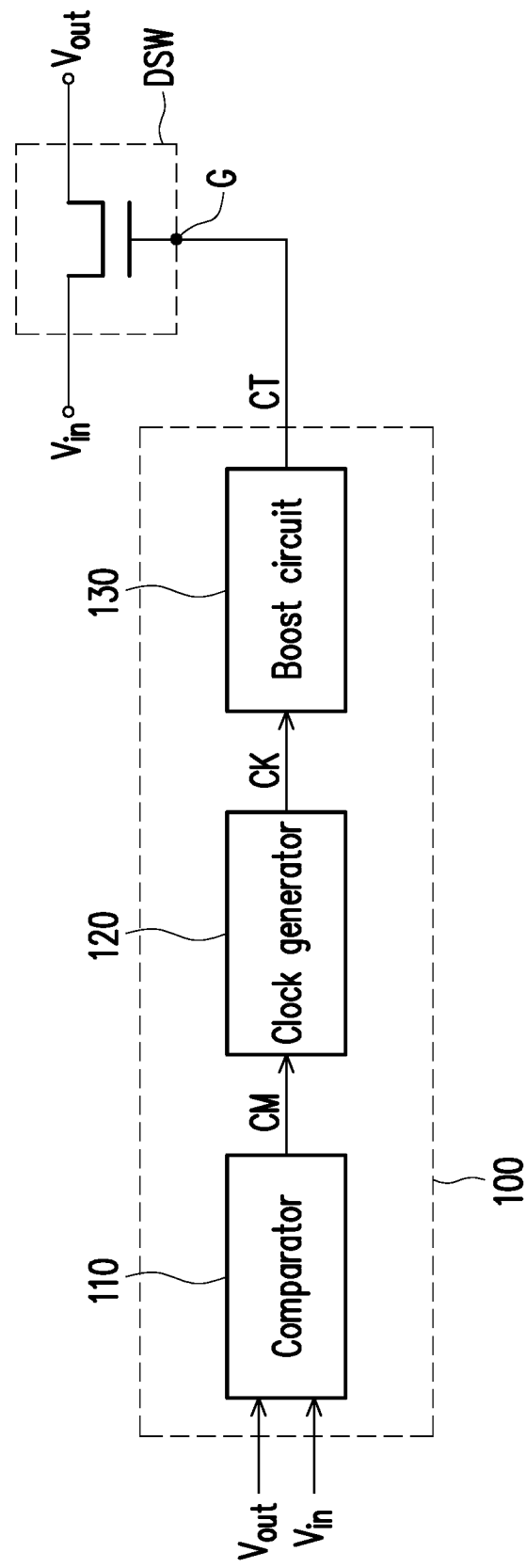
FIG. 1 is a schematic diagram illustrating a control circuit and a driving switch according to an embodiment of the invention.

In the drawings and the embodiments of the invention, identical or similar reference numbers are employed to represent identical or similar elements. Elements/components with the same reference numerals in different embodiments may be cross-referenced to the related description.

FIG. 1 is a schematic diagram illustrating a control circuit and a driving switch according to an embodiment of the invention. Referring to FIG. 1, a control circuit 100 may control a driving switch DSW. The driving switch DSW may be a transistor switch, and two terminals of the driving switch DSW may respectively receive an input voltage Vin and an output voltage Vout. The control circuit 100 includes a comparator 110, a clock generator 120, and a boost circuit 130. The comparator 110 may receive the input voltage Vin and the output voltage Vout and compare a voltage level of the input voltage Vin with a voltage level of the output voltage Vout to generate a comparison signal CM.

The clock generator 120 is coupled to the comparator 110, so as to receive the comparison signal CM. The clock generator 120 may generate a clock signal CK according to the comparison signal CM. For instance, the clock generator 120 may, based on the comparison signal CM, enable the clock signal CK to have a first frequency in a first time interval and to have a second frequency in a second time interval, wherein the first frequency of the clock signal CK is higher than the second frequency, and the first time interval occurs before the second time interval.

The boost circuit 130 is coupled to the clock generator 120 and a control terminal G of the driving switch DSW. The boost circuit 130 may generate a control signal CT of the driving switch DSW according to the received clock signal CK. For instance, the boost circuit 130 may pull up a voltage level of the control signal CT according to a first driving capability in the first time interval and generate the control signal CT according to a second driving capability in the second time interval, wherein the first driving capability is greater than the second driving capability. In this way, the boost circuit 130 may quickly boost a voltage level of the control terminal G via the control signal CT, so as to quickly activate the driving switch DSW.

Specifically, when the driving switch DSW is in a turned-off state, and when the comparator 110 compares that the output voltage Vout is smaller than the input voltage Vin, the control circuit 100 may enter the first time interval. In the meantime, the comparator 110 may provide the generated comparison signal CM to the clock generator 120 and enable the clock generator 120 to generate the clock signal CK with a relatively high frequency (i.e., a first frequency) in the first time interval. The boost circuit 130 may quickly pull up the voltage level of the control signal CT and quickly turn on the driving switch DSW according to the clock signal CK in the first time interval.

On the other hand, after the first time interval is maintained for a predetermined time period, the control circuit 100 may enter the second time interval. In the meantime, the clock generator 120 may generate the clock signal CK with a relatively low frequency (i.e., a second frequency) in the second time interval. The boost circuit 130 may effectively maintain the voltage level of the control signal CT according to the clock signal CK in the second time interval.

By allowing the boost circuit 130 to have the clock signal CK having the relatively high frequency (i.e., the first frequency) in the first time interval, the boost circuit 130 may turn on the driving switch DSW in a high-speed operation manner in the first time interval, thereby achieving an effect of reducing the time of activating the driving switch DSW. In addition, by allowing the boost circuit 130 to have the clock signal CK having the relatively low frequency (i.e., the second frequency) in the second time interval, the boost circuit 130 may maintain the driving switch DSW in a normal operation in a low-speed operation manner in the second time interval, thereby achieving a power-saving effect.

Figure 2:
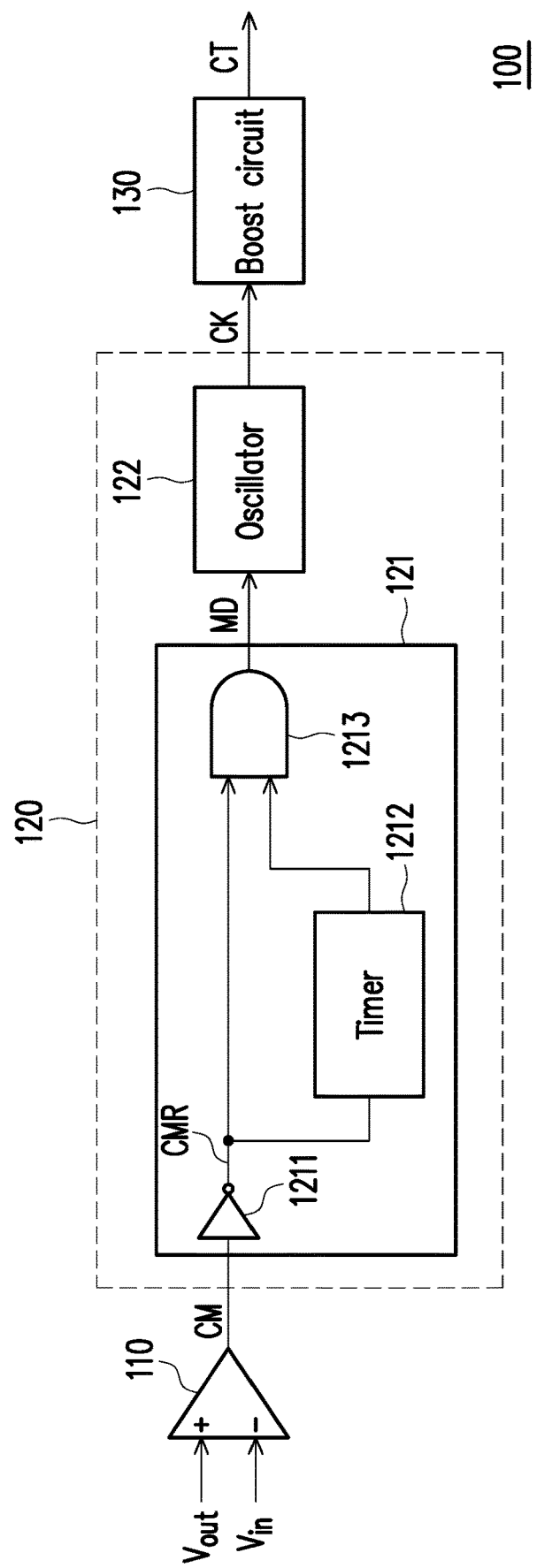
FIG. 2 is a schematic diagram of the control circuit depicted in FIG. 1 according to an embodiment of the invention.

FIG. 2 is a schematic diagram of the control circuit 100 depicted in FIG. 1 according to an embodiment of the invention. Referring to FIG. 2, the control circuit 100 includes the comparator 110, the clock generator 120, and the boost circuit 130. The two input terminals of the comparator 110 may receive the input voltage Vin and the output voltage Vout respectively, and an output terminal of the comparator 110 generates the comparison signal CM according to a comparison result of the input voltage Vin and the output voltage Vout.

In the embodiment illustrated in FIG. 2, the clock generator 120 includes a mode signal generator 121 and an oscillator 122. The mode signal generator 121 is coupled to the comparator 110, so as to receive the comparison signal CM. The mode signal generator 121 may further perform a timing operation according to the comparison signal CM. For example, when the driving switch DSW illustrated in FIG. 1 is in the turned-off state, and the comparison signal CM indicates that the voltage level of the output voltage is greater than the voltage level of the input voltage, the mode signal generator 121 may start the timing operation.

The mode signal generator 121 may further generate a mode signal MD by the timing operation. For example, as illustrated in FIG. 2, the mode signal generator 121 includes an inverter 1211, a timer 1212 and a logic operator 1213. An input terminal of the inverter 1211 is coupled to the output terminal of the comparator 110, and an input terminal of the timer 1212 and a first input terminal of the logic operator 1213 are respectively coupled to an output terminal of the inverter 1211. An output terminal of the timer 1212 is coupled to a second input terminal of the logic operator 1213.

The inverter 1211 may generate an inverted comparison signal CMR according to the comparison signal CM and transmit the inverted comparison signal CMR to the timer 1212, and the timer 1212 may start the timing operation according to the inverted comparison signal CMR to generate a timing result. The logic operator 1213 (which may be an AND gate, for example) may execute a logic operation on the inverted comparison signal CMR and the timing result to generate the mode signal MD.

In the present embodiment, if it is assumed that the timer 1212, in a state of timing the first time interval, may transmit a high-level timing signal to the logic operator 1213 and assumed that the inverted comparison signal CMR may be at a high level in the first time interval, in the first time interval, the logic operator 1213 may generate the mode signal MD at a high level. Similarly, in the second time interval, the timer 1212 may transmit a low-level timing signal to the logic operator 1213, such that the logic operator 1213 may generate the mode signal MD at a low level.

In other embodiments, the mode signal MD may be at a first logic level (e.g., a low level) in the first time interval, and the mode signal MD may be at a second logic level (e.g., a high level) in the second time interval, as if the first logic level and the second logic level are different.

It should be additionally mentioned that the mode signal generator 121 illustrated in FIG. 2 may be disposed without the inverter 1211, and as such, the timer 1212 may perform the timing operation directly according to the comparison signal CM. For example, when the driving switch DSW illustrated in FIG. 1 is in the turned-off state, and the comparison signal CM indicates that the voltage level of the input voltage is greater than the voltage level of the output voltage, the timer 1212 may start the timing operation, and the logic operator 1213 may execute the logic operation on the comparison signal CM and the timing result to generate the mode signal MD.

Referring again to FIG. 2, the oscillator 122 is coupled to the mode signal generator 121 to receive the mode signal MD. The oscillator 122 may generate the clock signal CK according to the mode signal MD and adjust a frequency of the clock signal CK based on a logic level of the mode signal MD. For instance, the mode signal generator 121 may generate the mode signal MD having different logic levels respectively in the first time interval and the second time interval, and the first time interval occurs before the second time interval. When the mode signal MD is at a high level in the first time interval, the oscillator 122 may enable the clock signal CK to have a first frequency, and when the mode signal MD is at a low level in the second time interval, the oscillator 122 may enable the clock signal CK to have a second frequency. The second frequency is less than the first frequency.

In this way, the boost circuit 130 may provide a higher driving capability according to the clock signal CK having the relatively high frequency in the first time interval and quickly turn on the driving switch DSW according the higher driving capability. After the turned-on state of the driving switch DSW is stabilized, the boost circuit 130 may provide a lower driving capability according to the clock signal CK having the relatively low frequency in the second time interval, thereby maintaining the driving switch DSW in the normal operation.

Figure 3:
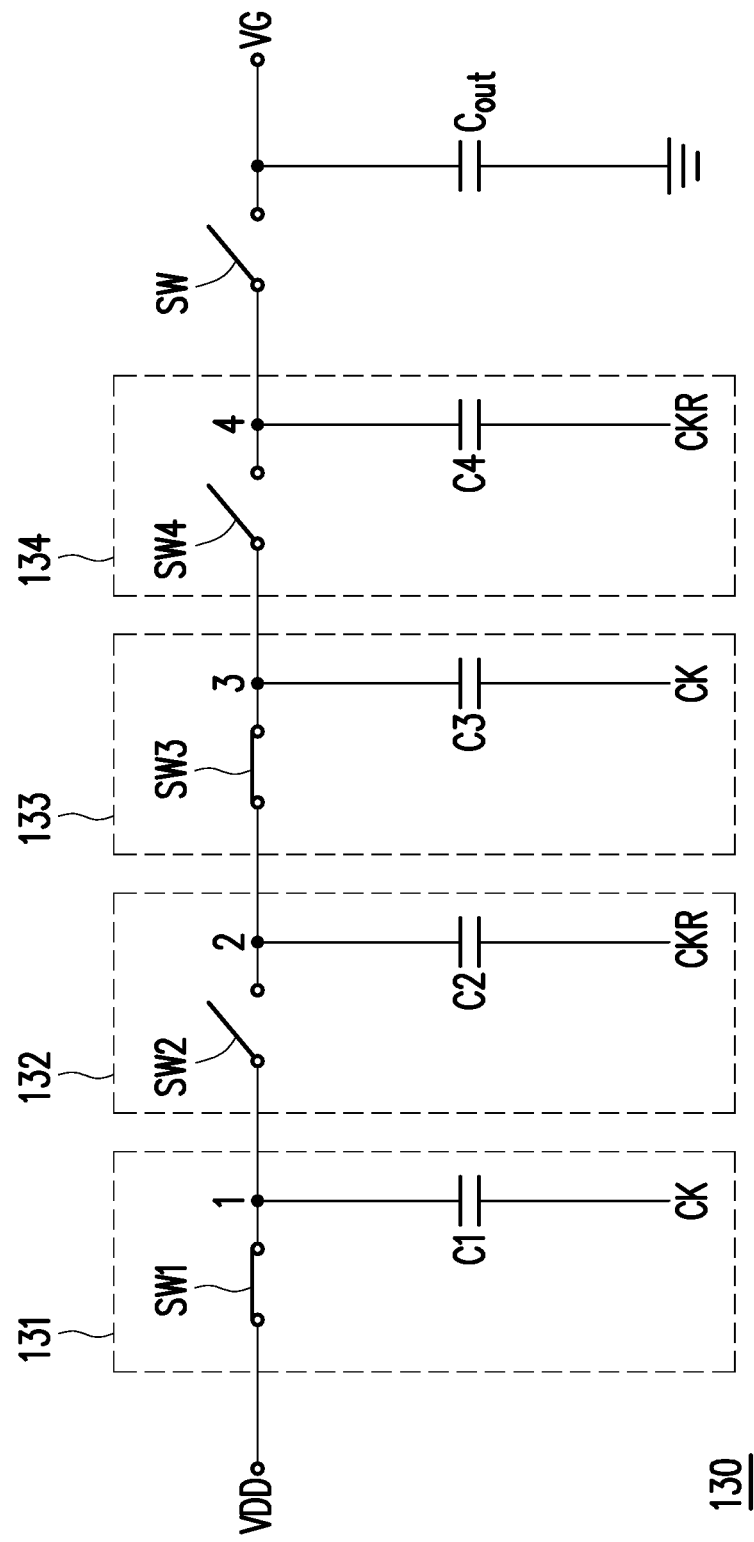
FIG. 3 is a schematic diagram illustrating a boost circuit according to an embodiment of the invention.

Moreover, the boost circuit 130 illustrated in FIG. 2 may be a charge pump circuit. For instance, FIG. 3 is a schematic diagram illustrating a boost circuit according to an embodiment of the invention. Referring to FIG. 3, the boost circuit 130 includes 4 sub boost circuits 131-134, a switch SW and an output capacitor Cout. The boost circuit 130 may receive the power provided by a voltage source VDD and perform a switch operation on switches SW1-SW4 and the switch SW according to the clock signal CK and an inverted clock signal CKR, so as to charge capacitors C1-C4 in the sub boost circuits 131-134.

For the sub boost circuit 131, when the clock signal CK in at the low level, the switch SW1 is turned on, and the voltage source VDD charges the capacitor C1, thereby boosting a voltage of a node 1 to VDD. When the clock signal CK is at the high level, the switch SW2 is turned on, the sub boost circuit 131 may transfer the energy stored in the capacitor C1 to the sub boost circuit 132 and charges the capacitor C2, thereby boosting a voltage of a node 2 to 2×VDD. In the same way, voltages of nodes 3 and 4 continue to be boosted until the energy stored in the capacitors C1-C4 are all transferred to the output capacitor Cout. In this way, the boost circuit 130 may boost a control voltage VG of the driving switch DSW to 4×VDD.

It should be additionally mentioned that the 4 sub boost circuits 131-134 are merely illustrated in FIG. 3 as an example for description, and the number of the sub boost circuits disposed in the boost circuit 130 is not limited in the invention.

Figure 4A:
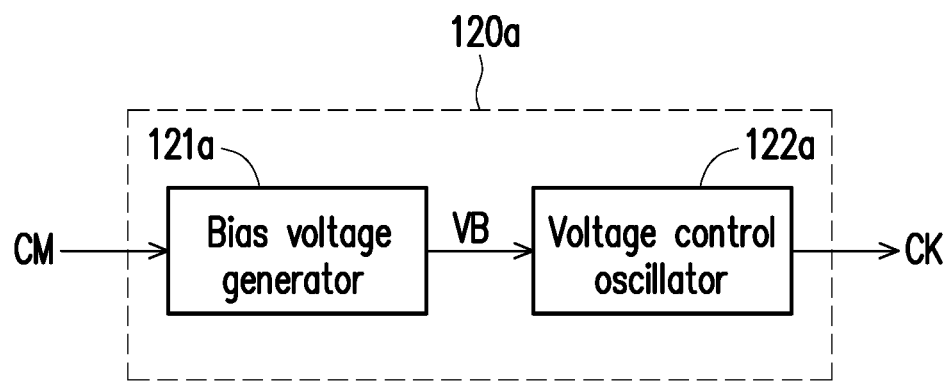
FIG. 4A is a schematic diagram illustrating a clock generator according to another embodiment of the invention.

FIG. 4A is a schematic diagram illustrating a clock generator according to another embodiment of the invention. Referring to FIG. 4A, a clock generator 120a includes a bias voltage generator 121a and a voltage control oscillator 122a. The bias voltage generator 121a may receive the comparison signal CM and generate a bias voltage VB according to the comparison signal CM. The voltage control oscillator 122a is coupled to the bias voltage generator 121a, so as to receive the bias voltage VB. The voltage control oscillator 122s may generate the clock signal CK according to the bias voltage VB and adjust the frequency of the clock signal CK according to a level of the bias voltage VB.

Figure 4B:
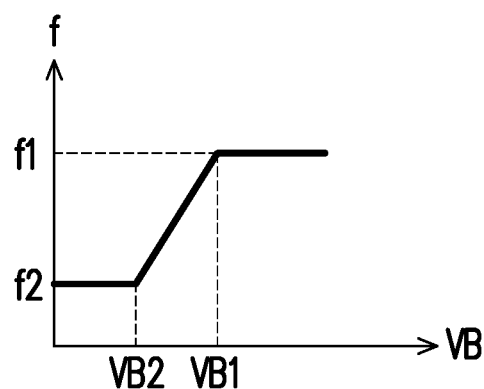
FIG. 4B is a schematic diagram illustrating the voltage control oscillator depicted in FIG. 4A changing a frequency of the clock signal through the bias voltage.

For instance, FIG. 4B is a schematic diagram illustrating the voltage control oscillator 122a depicted in FIG. 4A changing a frequency f of the clock signal CK through the bias voltage VB. Referring to FIG. 4B, when the bias voltage VB is greater than a first critical value VB1, the voltage control oscillator 122a may enable the clock signal CK to have a first frequency f1, and when the bias voltage VB is smaller than a second critical value VB2, the voltage control oscillator 122a may enable the clock signal CK to have a second frequency f2. The second frequency f2 is less than the first frequency f1. When the bias voltage VB is between the second critical value VB2 and the first critical value VB1, the voltage control oscillator 122a may enable the clock signal CK to have a third frequency between the first frequency f1 and the second frequency f2. The third frequency is proportional to the bias voltage VB.

The voltage control oscillator 122a may provide the clock signal CK having the first frequency f1 to the boost circuit 130 in the first time interval and may provide the clock signal CK having the second frequency f2 to the boost circuit 130 in the second time interval. Because the second frequency f2 is less than the first frequency f1, the boost circuit 130 may provide a higher driving capability according to the clock signal CK having the relatively high frequency in the first time interval to pull up the voltage level of the control signal CT and may provide a lower driving capability according to the clock signal CK having the relatively low frequency in the second time interval to generate the control signal CT. In this way, the boost circuit 130 may quickly boost the voltage level of the control terminal G via the control signal CT, so as to quickly activate the driving switch DSW.

Figure 5:
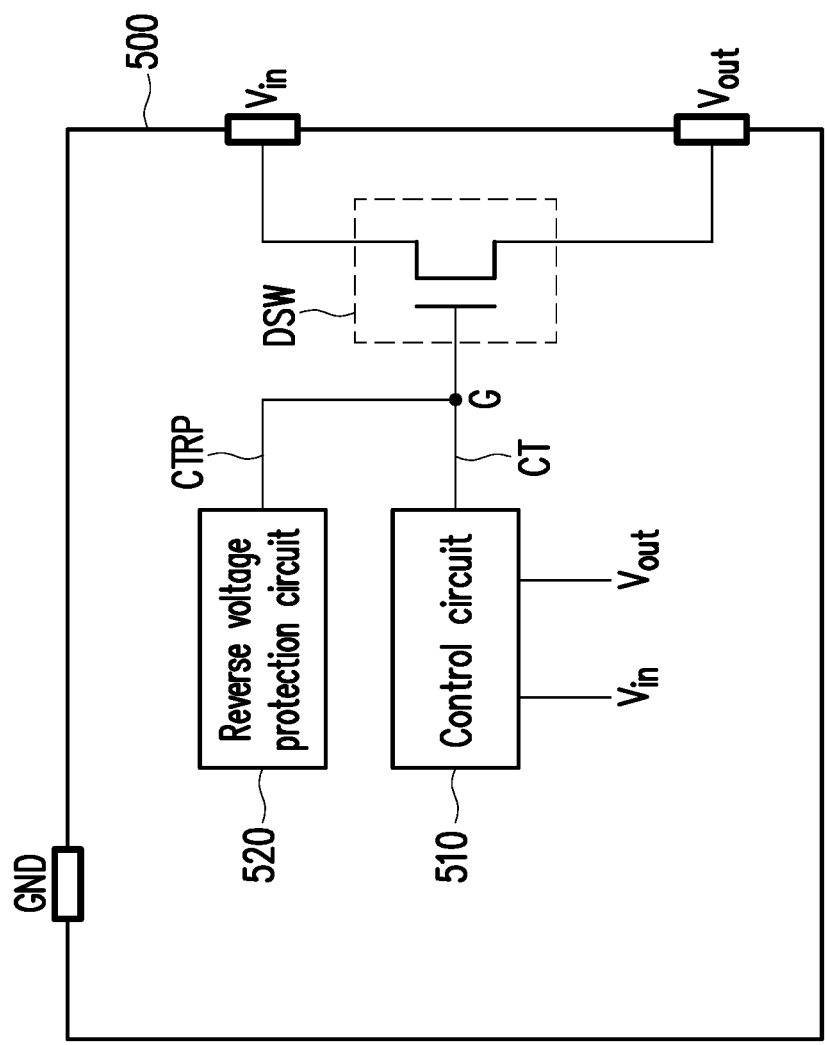
FIG. 5 is a schematic diagram illustrating a voltage converting circuit according to an embodiment of the invention.

FIG. 5 is a schematic diagram illustrating a voltage converting circuit according to an embodiment of the invention. A voltage converting circuit 500 includes the driving switch DSW, a control circuit 510 and a reverse voltage protection circuit 520. The voltage converting circuit 500 has a plurality of pins to respectively receive the input voltage Vin, the output voltage Vout and a reference potential GND.

The control circuit 510 and the reverse voltage protection circuit 520 are respectively coupled to the control terminal G of the driving switch DSW. The control circuit 510 receives the input voltage Vin and the output voltage Vout and determines whether to pull up the voltage level of the control signal CT according to a comparison result of the input voltage Vin and the output voltage Vout.

When a scenario that the output voltage Vout is transiently greater than the input voltage Vin (i.e., a reverse voltage state) occurs, the reverse voltage protection circuit 520 activates a reverse voltage protection mechanism and provides a reverse control signal CTRP to the control terminal G of the driving switch DSW, so as to turn off the driving switch DSW. After the reverse voltage protection mechanism is relieved, and when the control circuit 510 determines that the input voltage Vin becomes greater than the output voltage Vout, the control circuit 510 may generate the control signal CT to quickly turn on the driving switch DSW, such that the driving switch DSW may quickly enter the normal operation state.

Regarding the implementation details of the control circuit 510, detailed description has been set forth in the embodiments above and will not be repeated.

Based on the above, in the embodiments of the invention, the control circuit of the voltage converting circuit is disposed with the boost circuit. The boost circuit can receive the clock signal at different frequencies respectively in the first time interval and the second time interval, so as to pull up the control signal of the driving switch according to the first driving capability in the first time interval and to generate the control signal of the driving switch according to the second driving capability in the second time interval, wherein the first driving capability is greater than the second driving capability. In this way, when the reverse voltage protection mechanism of the voltage converting circuit is relieved, the control circuit can quickly activate the driving switch via the boost circuit, such that the driving switch can quickly enter the normal operation state.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A control circuit for controlling a driving switch which has two terminals respectively receiving an input voltage and an output voltage, the control circuit comprising:
   a comparator, receiving the input voltage and the output voltage and comparing a voltage level of the input voltage with a voltage level of the output voltage to generate a comparison signal;
   a clock generator, coupled to the comparator to receive the comparison signal and generating a clock signal according to the comparison signal, so as to enable the clock signal to have a first frequency in a first time interval and to have a second frequency in a second time interval, wherein the first frequency is higher than the second frequency, and the first time interval occurs before the second time interval; and
   a boost circuit, coupled to the clock generator and a control terminal of the driving switch to receive the clock signal, pulling up a voltage level of a control signal of the driving switch according to a first driving capability in the first time interval and generating the control signal according to a second driving capability in the second time interval, wherein the first driving capability is greater than the second driving capability,
   wherein the clock generator comprises:
      a mode signal generator, coupled to the comparator, receiving the comparison signal and performing a timing operation according to the comparison signal, so as to generate a mode signal; and
      an oscillator, coupled to the mode signal generator, receiving the mode signal and adjusting a frequency of the clock signal according to the mode signal,
   wherein the mode signal generator comprises:
      a timer, performing the timing operation based on the comparison signal to generate a timing result; and
      a logic operator, coupled to the timer and executing a logic operation according to the comparison signal and the timing result to generate the mode signal.

2. The control circuit according to claim 1, wherein the mode signal is at a first logic level in the first time interval, and the mode signal is at a second logic level in the second time interval, wherein the first logic level and the second logic level are different.

3. The control circuit according to claim 1, wherein when the driving switch is in a turned-off state, and the voltage level of the input voltage is greater than the voltage level of the output voltage, the timer activates the timing operation.

4. The control circuit according to claim 1, wherein the boost circuit is a charge pump circuit.

5. A voltage converting circuit, comprising:
   a driving switch; and
   a control circuit as recited in claim 1, wherein the control circuit is coupled to a control terminal of the driving switch and boosts a voltage level of the control terminal according to the clock signal.

6. The voltage converting circuit according to claim 5, further comprising:
   a reverse voltage protection circuit, coupled to the control terminal of the driving switch and when a reverse voltage state occurs, providing a reverse control signal to the control terminal of the driving switch to drive the driving switch to be turned off.

7. A control circuit for controlling a driving switch which has two terminals respectively receiving an input voltage and an output voltage, the control circuit comprising:
   a comparator, receiving the input voltage and the output voltage and comparing a voltage level of the input voltage with a voltage level of the output voltage to generate a comparison signal;
   a clock generator, coupled to the comparator to receive the comparison signal and generating a clock signal according to the comparison signal, so as to enable the clock signal to have a first frequency in a first time interval and to have a second frequency in a second time interval, wherein the first frequency is higher than the second frequency, and the first time interval occurs before the second time interval; and
   a boost circuit, coupled to the clock generator and a control terminal of the driving switch to receive the clock signal, pulling up a voltage level of a control signal of the driving switch according to a first driving capability in the first time interval and generating the control signal according to a second driving capability in the second time interval, wherein the first driving capability is greater than the second driving capability,
   wherein the clock generator comprises:

a bias voltage generator, coupled to the comparator, receiving the comparison signal and generating a bias voltage according to the comparison signal; and a voltage control oscillator, coupled to the bias voltage generator, receiving the bias voltage to generate the clock signal and determining a frequency of the clock signal according to the bias voltage, wherein the voltage control oscillator is configured to:

enable the clock signal to have a first frequency when the bias voltage is greater than a first critical value;

enable the clock signal to have a second frequency when the bias voltage is less than a second critical value, wherein the second frequency is less than the first frequency; and enable the clock signal to have a third frequency when the bias voltage is between the second critical value and the first critical value, wherein the third frequency is proportional to the bias voltage, and the third frequency is between the second frequency and the first frequency.

\* \* \* \* \*